United States Patent [19]

Costello

[11] Patent Number: 5,160,929
[45] Date of Patent: Nov. 3, 1992

[54] SYSTEM FOR PARALLEL COMMUNICATION OF BINARY DATA VIA TRINARY TRANSMISSION LINES

[76] Inventor: John F. Costello, 6243 Buisson St., San Diego, Calif. 92122

[21] Appl. No.: 680,431

[22] Filed: Apr. 4, 1991

[51] Int. Cl.5 .............................................. H03M 5/16
[52] U.S. Cl. .......................................... 341/57; 375/17
[58] Field of Search ............................... 341/55, 56, 57

[56] References Cited

U.S. PATENT DOCUMENTS

| | | | |
|---|---|---|---|
| Re. 30,182 | 12/1979 | Howson | 341/57 |
| 2,700,696 | 1/1955 | Barker | 375/17 X |
| 3,274,611 | 9/1966 | Brown et al. | 341/57 |
| 3,876,944 | 4/1975 | Mack et al. | 325/141 |
| 4,387,366 | 6/1983 | Chow | 341/57 |
| 4,631,428 | 12/1986 | Grimes | 307/475 |
| 4,779,073 | 10/1988 | Iketani | 341/55 |
| 4,860,309 | 8/1989 | Costello | 375/17 |
| 4,910,750 | 3/1990 | Fisher | 375/19 |

Primary Examiner—Marc Hoff
Attorney, Agent, or Firm—Thomas J. Tighe

[57] ABSTRACT

Binary encoded information having a word size of 3N bits, where "N" is a positive integer, plus a parallel data clock are converted to corresponding control signals. Signal drivers with three-state outputs respond to the control signals and communicate corresponding signals via transmission lines, one transmission line per signal driver, to receiving circuits capable of detecting three-state signals, an embodiment of said circuits produce bipolar signals corresponding to the state of the transmission lines with which they communicate. A code converter produces binary signals and a data clock corresponding to the bipolar signals from the receiving circuits. The net result is that the binary word and data clock produced at a receiving end of the transmission lines logically matches the binary code and data clock applied at a sendng end, and that the produced data clock has the same timing relationship with the received binary word as does the originating data clock have with the originating binary word.

3 Claims, 1 Drawing Sheet

SYSTEM FOR PARALLEL COMMUNICATION OF BINARY DATA VIA TRINARY TRANSMISSION LINES

BACKGROUND OF THE INVENTION

1. Field of the Invention

This invention relates in general to systems for communicating binary encoded information in parallel via multiple trinary transmission lines.

2. Prior Art

It is well known that the transfer of binary encoded information via transmission lines in parallel can achieve much higher transfer rates than serial transfers. Parallel transmission is done by grouping the binary information into sets of binary bits (e.g., bytes which have a bit width of eight binary bits), and transferring a full set at a time, the binary bits of the set being transmitted simultaneously, i.e. in parallel. Transfer of a set of binary bits in parallel conventionally requires one transmission line per bit. Thus nine transmission lines are conventionally required to transfer a byte along with a check bit (such as a parity bit) in parallel. If the data is transmitted differentially then each transmission line is a pair of signal lines and each binary bit transferred in parallel requires a separate signal line pair.

Also, a signal marking points or periods in time when the transmitted data is valid on the transmission lines must be transmitted immediately before, after or along with the data. This signal is commonly referred to as a "data clock." For serial transmission of binary data via a single transmission line, the data clock can be encoded with the data, such as by using a Manchester encoding scheme, or it can be sent along with the data via a second transmission line. But when binary data is sent via parallel transmission lines time skewing of data and other factors typically require that the data clock be sent via a separate transmission line, thus necessitating an additional transmission line.

According to the invention described herein, sets of binary encoded information are converted to a three-state, i.e. trinary, encoded form suitable for transmission via two, or multiples of two, trinary transmission lines. A trinary transmission line according to this invention is a signal path between a three-state driver and a three-state receiving circuit. As will be explained herein, converting the data from a binary to a trinary form leaves at least one trinary state not needed for data and which state therefore can be used as a data clock. The system of this invention transfers all the information contained in the original binary form but requires fewer transmission lines for transfer, and moreover provides a data clock without the need for a separate data clock transmission line. For example, three binary bits and a data clock conventionally transmitted in parallel via four binary transmission lines can be converted and transferred using only two trinary transmission lines. As another example, nine binary bits, representing a byte of information plus one check bit and a data clock can be transferred, including a data clock, using only six transmission lines. For a given clock rate, the data transfer rate is thereby increased because more information can be transferred per line per clock.

The invention can also be used to advantage to increase the transmission rate of data over present systems that use one or two wire-pairs to cover long distances. The transmission rate of a single or two wire-pair system is limited by the wire medium used and the distance between transmitter and receiver. A data transmission system according to this invention using the same wire medium and over the same distance can increase the data rate by a factor of nine (i.e. from 1,000,000 to 9,000,000 bits per second) when six wire-pairs are used. A system according to this invention is self-timing and can transmit 1.5 binary bits of worth of information per transmission line pair for each clock time, and the long distance transmission characteristics of differential signaling is maintained.

Other advantages and attributes of this invention will be discussed hereinafter and will be apparent upon a reading of the text hereinafter.

SUMMARY OF THE INVENTION

An object of this invention is to provide for parallel transmission of binary data using fewer transmission lines than is used conventionally.

A further object of this invention is to provide a system as described in the preceding paragraph that s self-clocking.

A further object of this invention is to provide a system as described in the two preceding paragraphs that can use the same wire medium and extend over the same distances as serial transmission lines but yet can increase data transfer rates by at least a factor of nine.

These and other objects are achieved by a system for communicating 3N binary digits plus a data clock in parallel, "N" being a positive integer, comprising: (a) means for converting the 3N binary digits plus the data clock to a set of control signals corresponding to 2N trinary digits, (b) means responsive to the set of control signals for communicating signals corresponding to said 2N trinary digits via transmission lines, one transmission line per trinary digit and (c) means in signal communication with said transmission lines for converting said signals corresponding to said 2N trinary digits to corresponding binary digits plus a data clock. The means responsive to the set of control signals can comprise 2N signal drivers and the control signals are used to modulate the outputs of the drivers which differentially communicate signals to respectively associated transmission lines, each transmission line being a suitably terminated pair of signal lines. The drivers can be differential, balanced line drivers having a third state in which the output of the driver presents a relatively high impedance to the transmission line it is driving. Preferably, a signal receiving means in communication with each of said transmission lines produces bi-polar signals corresponding to signals on their respective transmission lines, and code conversion means convert the bi-polar code to binary digits plus a data clock.

DESCRIPTION OF THE PREFERRED EMBODIMENT

Figure 1:
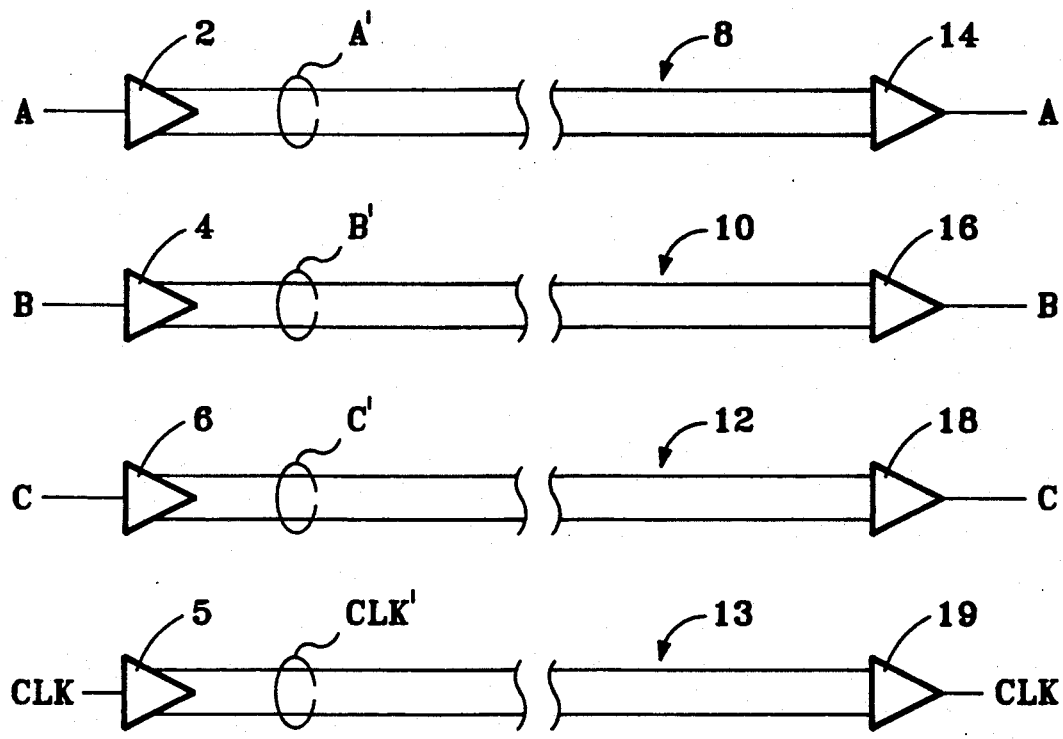
FIG. 1 is a functional diagram of a prior art transmission bus for transferring binary encoded information.

Referring to FIG. 1, a conventional transmission bus for differentially transferring binary data is illustrated. Data being transferred is pre-encoded as a binary word having three bipolar binary digits, or bits, "A", "B" and "C". The three binary bits are applied separately as signals to the data inputs of three differential drivers, 2, 4 and 6 respectively. The differential output of each driver communicates with an associated transmission line. The transmission lines are illustrated as three signal line pairs, i.e., three pairs of differential signal lines, generally designated 8, 10 and 12 respectively. The drivers convert their respective bipolar input signals (A, B, and C) to corresponding differential signals (A', B' and C') and impose the differential signals on their respectively associated transmission lines. Sent in parallel with the data via a fourth transmission line 13 is a data clock (Clk) which is a signal indicating times or points in time when the transmitted data is valid on the transmission lines. The data clock driver 5 operates the same as the data drivers.

Referring again to FIG. 1, also communicating with transmission lines, 8, 10 and 12, are the differential inputs of three receivers, 14, 16 and 18 respectively. The receivers convert the differential signals (A', B' and C') present at their respective inputs to corresponding bipolar signals (A, B and C) which match, at least logically, the signals present at the inputs of the drivers. The data clock receiver 19 operates the same as the other receivers.

As in the prior art, the transmission lines of this invention are preferably signal line pairs driven differentially, however differential drivers of the kind used in this invention when connected to a transmission line can communicate three states to the transmission line. These drivers are commonly referred to as three-state drivers. The differential driver can be: (1) "OFF" which is a mode in which the differential driver output, looking from the transmission line, appears as a relative )y high impedance (relative to the characteristic impedance of the transmission line), (2) "HI" which is a relatively low impedance, current driving and sinking mode in which the differential driver output is in a first of two possible polarity states, and (3) "LOW" which is a relatively low impedance, current sinking and driving mode in which the differential driver output is in the second polarity state. Thus a transmission line driven by a three-state driver can be put into, and communicate, three distinct states. Two such differential drivers connected to two separate transmission lines can therefore communicate three times three states, i.e. nine states, via the two transmission lines. This can be expressed in a truth table of the outputs of two such drivers as in Table 1 below:

TABLE 1

| State | Driver 1 | Driver 2 |
|---|---|---|
| 1 | OFF | OFF |
| 2 | LOW | OFF |
| 3 | OFF | LOW |
| 4 | LOW | LOW |
| 5 | HI | LOW |
| 6 | HI | OFF |
| 7 | OFF | HI |
| 8 | LOW | HI |
| 9 | HI | HI |

Thus two trinary line drivers can be used to communicate nine distinct states over only two transmission lines. As will be explained further eight of these states are assigned to uniquely represent the eight possible states of a three-bit binary word, state 1 (OFF, OFF) preferably not being used as a data state but as a data clock.

Figure 2:
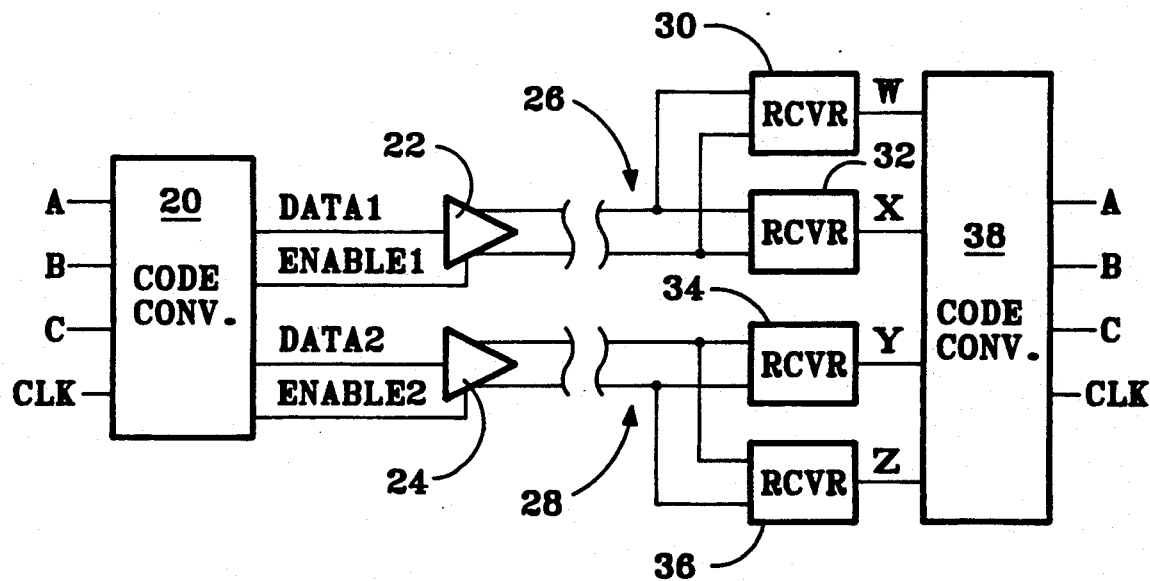
FIG. 2 is a functional diagram of a transmission bus for transferring binary encoded information by means according to this invention.

Referring to FIG. 2, the three-bit binary word (ABC) of FIG. 1 along with the data clock (Clk) are applied to the input of a driver-side code converter 20. The code converter converts the three data bits and the data clock to four control signals (Data1, Enable1, Data2, and Enable2) which control the output states of two three-state differential drivers, 22 and 24. Each driver communicates its output states as differential signals to a separate transmission line, the two transmission lines being herein illustrated as two pairs of signal lines, generally designated 26 and 28. Communicating with the transmission lines at a position on the transmission lines remote from the drivers are the differential inputs of four receivers, 30, 32, 34 and 36, two parallel connected differential receivers per transmission line. Each pair of receivers associated with a transmission line produce two bipolar bits of which three combined states uniquely correspond to the three states of the transmission line driver's output. The outputs of the four receivers (W, X, Y and Z) are fed to a receiver-side code converter 38 which converts them to a three-bit binary word and a data clock. The binary word is essentially a logical reproduction of the binary word transmitted, and the receiver-side data clock is essentially a reproduction of the driver-side data clock, the receiver-side data clock having substantially the same time relationship to the received binary word as the driver-side data clock has to the transmitted binary word. According to this invention, preferably each of the states 2 through 9 listed in Table 1 are assigned to uniquely correspond to one of the eight possible states that can be represented by a three-bit binary word (ABC), and state 1 is assigned as a data clock state. The corresponding elements of this assignment are listed in a truth table, Table 2, below:

TABLE 2

| State | Driver 1 | Driver 2 | ABC | Clk |
|---|---|---|---|---|
| 1 | OFF | OFF | XXX | 1 |
| 2 | LOW | OFF | 000 | 0 |
| 3 | OFF | LOW | 100 | 0 |
| 4 | LOW | LOW | 010 | 0 |
| 5 | HI | LOW | 110 | 0 |
| 6 | HI | OFF | 001 | 0 |
| 7 | OFF | HI | 101 | 0 |
| 8 | LOW | HI | 011 | 0 |
| 9 | HI | HI | 111 | 0 |

("0" = false, "1" = true, "X" indicates that it matters not whether it is 0 or 1.)

Referring again to FIG. 2, each differential driver has two inputs, a "Data" input and an "Enable" input. As explained above the driver output has three states: OFF, HI and LOW. The three output states are controlled by the two inputs as listed in Table 3:

TABLE 3

| Enable | Data | Output |
|---|---|---|
| 0 | X | OFF |
| 1 | 0 | LOW |
| 1 | 1 | HI |

Signals are applied to the respective Data and Enable inputs of the two drivers to produce the states, i.e., signals corresponding to the combinations of the three-bit binary code and data clock listed in Table 2. These input signals and their one-to-one correspondence to the binary code combinations and data clock are listed below in Table 4:

TABLE 4

| ABC | Clk | Driver 1 Output | Data 1 | Enable 1 | Driver 2 Output | Data 2 | Enable 2 |
|-----|-----|-----------------|--------|----------|-----------------|--------|----------|
| XXX | 1 | OFF | X | 0 | OFF | X | 0 |
| 000 | 0 | LOW | 0 | 1 | OFF | X | 0 |
| 100 | 0 | OFF | X | 0 | LOW | 0 | 1 |
| 010 | 0 | LOW | 0 | 1 | LOW | 0 | 1 |
| 110 | 0 | HI | 1 | 1 | LOW | 0 | 1 |
| 001 | 0 | HI | 1 | 1 | OFF | X | 0 |
| 101 | 0 | OFF | X | 0 | HI | 1 | 1 |
| 011 | 0 | LOW | 0 | 1 | HI | 1 | 1 |
| 111 | 0 | HI | 1 | 1 | HI | 1 | 1 |

It should be noted that correspondence between the three-bit binary code data clock, and the inputs of the drivers as illustrated in Table 4 is not the only correspondence that can be selected without departing from the objects and scope of this invention. Other correspondent relationships can be selected. The only requirement is that each of the eight possible combinations of the three-bit binary code plus clock must uniquely correspond to the nine possible combinations of the states of the two drivers' outputs.

Logic equations for implementation of the driver-side code converter for controlling two such differential drivers, as described above, by three binary bits (ABC) and a data clock (Clk) are as follows:

Equations 1

$$\text{Driver 1 Data} = A \cdot B \cdot \bar{C} + \bar{A} \cdot \bar{B} \cdot C + A \cdot B \cdot C$$

$$\text{Driver 1 Enable} = [\bar{A} \cdot \bar{B} \cdot \bar{C} + \bar{A} \cdot B \cdot \bar{C} + A \cdot B \cdot \bar{C} +$$

$$\bar{A} \cdot \bar{B} \cdot C + \bar{A} \cdot B \cdot C + A \cdot B \cdot C] \cdot \overline{Clk}$$

$$\text{Driver 2 Data} = A \cdot \bar{B} \cdot C + \bar{A} \cdot B \cdot C + A \cdot B \cdot C$$

$$\text{Driver 2 Enable} = [A \cdot \bar{B} \cdot \bar{C} + \bar{A} \cdot B \cdot \bar{C} + A \cdot B \cdot \bar{C} +$$

$$A \cdot \bar{B} \cdot C + \bar{A} \cdot B \cdot C + A \cdot B \cdot C] \cdot \overline{Clk}$$

The logic may be implemented using conventional circuit components such as integrated logic circuits, programmable gate arrays, mapped memory, or even discrete components.

The two receivers of each transmission line and the driver with which they communicate, as illustrated in FIG. 2, can be implemented using the three-state network interface receivers and drivers, respectively, disclosed in U.S. Pat. No. 4,860,309 issued to John F. Costello on Aug. 22, 1989, for a Trinary Bus Communication System, and illustrated therein in FIGS. 3 and 4. Said patent discloses three-state drivers and three-state receivers communicating with a network common bus.

Referring again to FIG. 2, the receivers, 30 and 32, of a first transmission line, 26, detect the three states transmitted by their associated line driver 22. The output W of receiver 30 will be logically true ("1") and the output X of receiver 32 will be logically false ("0") whenever the driver output is LOW. Conversely, the output X of receiver 32 will be logically true and the output W of receiver 30 will be logically false whenever the driver output is HI. Both outputs will be logically false (W=0 and X=0) whenever their associated driver is in the OFF state. The drivers and receivers of the second transmission line 28 operate in identical fashion. The relationship of the outputs of each receiver pair to their respectively associated driver's output is listed below in Table 5:

TABLE 5

| Driver | Receiver W | Receiver X |
|--------|-----------|-----------|
| OFF | 0 | 0 |
| LOW | 1 | 0 |
| HI | 0 | 1 |

Note that a receiver state where both outputs are logically true (W=1 and X=1) is not a valid state according to the drivers and receivers disclosed in the above-cited Costello Patent.

Referring again to FIG. 2, two drivers according to this invention are used to send three binary bits worth of information for each data clock cycle. Four receivers are used to detect signals from two drivers, one pair of receivers per driver. A first pair of receivers, 30 and 32, detect a three-state signal from a first transmission line 26 differentially driven by a first driver 22, and produce two bipolar signals, W and X respectively, the states of which uniquely correspond to the states of the detected signal. A second pair of receivers, 34 and 36, detect a three-state signal from a second transmission line 28 differentially driven by a second driver 24, and produce two bipolar signals, Y and Z respectively, the states of which uniquely correspond to the states of the detected signal. The states of the bipolar signals produced by the four receivers (as described in the aforesaid Costello patent) can in combination produce nine valid binary codes, enough to represent the eight possible codes of the transmitted binary word (ABC) and the transmitted data clock (Clk). The assignment, i.e., selection, of corresponding codes to be consistent with prior Tables can be as listed below in Table 6:

TABLE 6

| WXYZ | ABC | Clk |
|------|-----|-----|
| 0000 | XXX | 1 |
| 1000 | 000 | 0 |
| 0100 | 001 | 0 |
| 1100* | — | — |
| 0010 | 100 | 0 |
| 1010 | 010 | 0 |
| 0110 | 110 | 0 |
| 1110* | — | — |
| 0001 | 101 | 0 |
| 1001 | 011 | 0 |
| 0101 | 111 | 0 |
| 1101* | — | — |
| 0011* | — | — |
| 1011* | — | — |
| 0111* | — | — |
| 1111* | — | — |

*Invalid state

It should be noted that other output relationships can be used without departing from the objects and scope of this invention.

The design of the receiver-side code converter 38 follows the driver-side code converter 20 so that three driver-side input bits (ABC) plus data clock (Clk) produce a matching pattern of receiver-side output bits (ABC) plus data clock (Clk). The relationship between the transmitted data and clock, and the drivers and their respective receivers can be as listed in Table 7:

TABLE 7

| ABC | Clk | 1st Driver & Receivers Output | W | X | 2nd Driver & Receivers Output | Y | Z |
|-----|-----|-------------------------------|---|---|-------------------------------|---|---|
| XXX | 1 | OFF | 0 | 0 | OFF | 0 | 0 |
| 000 | 0 | LOW | 1 | 0 | OFF | 0 | 0 |
| 100 | 0 | OFF | 0 | 0 | LOW | 1 | 0 |
| 010 | 0 | LOW | 1 | 0 | LOW | 1 | 0 |

TABLE 7-continued

| | | 1st Driver & Receivers | | | 2nd Driver & Receivers | | |
|---|---|---|---|---|---|---|---|
| ABC | Clk | Output | W | X | Output | Y | Z |
| 110 | 0 | HI  | 0 | 1 | LOW | 1 | 0 |
| 001 | 0 | HI  | 0 | 1 | OFF | 0 | 0 |
| 101 | 0 | OFF | 0 | 0 | HI  | 0 | 1 |
| 011 | 0 | LOW | 1 | 0 | HI  | 0 | 1 |
| 111 | 0 | HI  | 0 | 1 | HI  | 0 | 1 |

Logic equations for implementation of the receiver-side code converter 38 for converting the receivers' bipolar outputs (WXYZ) back to the binary word (ABC) and data clock (Clk) can be as follows:

Equations 2

$$A = \bar{W}\cdot\bar{X}\cdot Y\cdot\bar{Z} + \bar{W}\cdot X\cdot Y\cdot\bar{Z} + \bar{W}\cdot\bar{X}\cdot\bar{Y}\cdot Z + \bar{W}\cdot X\cdot\bar{Y}\cdot Z$$

$$B = W\cdot\bar{X}\cdot Y\cdot\bar{Z} + \bar{W}\cdot X\cdot Y\cdot\bar{Z} + W\cdot\bar{X}\cdot\bar{Y}\cdot Z + \bar{W}\cdot X\cdot\bar{Y}\cdot Z$$

$$C = \bar{W}\cdot X\cdot\bar{Y}\cdot\bar{Z} + \bar{W}\cdot\bar{X}\cdot\bar{Y}\cdot Z + W\cdot\bar{X}\cdot\bar{Y}\cdot Z + \bar{W}\cdot X\cdot\bar{Y}\cdot Z$$

$$Clk = \bar{W}\cdot\bar{X}\cdot\bar{Y}\cdot\bar{Z}$$

Although the foregoing description pertains to an embodiment utilizing two trinary drivers to transfer in parallel three binary bits worth of information plus a data clock, it can easily be seen that this embodiment is a building block for broader parallel embodiments. For example, only four trinary transmission lines are needed to parallel transfer the data and clock information contained in a binary six-bit word and parallel data clock, and only six trinary transmission lines are needed to parallel transfer the data and clock information contained in a binary nine-bit word and parallel data clock. In the former example, a savings of three transmission lines over a conventional parallel binary transmission system is appreciated, and in the latter example, the savings is four transmission lines. Moreover there appears to be a relationship that for every 3N ("N" being a positive integer) binary bits of information to be transferred in parallel with an associated parallel data clock, trinary communication over 2N transmission lines can accomplish the transfer and a savings of N+1 transmission lines over a conventional binary transfer system will be realized.

The foregoing description and drawings were given for illustrative purposes only, it being understood that the invention is not limited to the embodiments disclosed, but is intended to embrace any and all alternatives, equivalents, modifications and rearrangements of elements falling within the scope of the invention as defined by the following claims.

I claim:

1. A system for communicating a combination of 3N binary digits plus a data clock, "N" being a positive integer, comprising:
   (a) means for converting the combination of the 3N binary digits and the data clock to a set of control signals corresponding to 2N trinary digits,
   (b) means responsive to the set of control signals for communicating 2N trinary digit signals via transmission lines, one transmission line per trinary digit signal and
   (c) means in signal communication with said transmission lines for converting said trinary digit signals to corresponding binary digits and a data clock.

2. The system according to claim 1 wherein the means responsive to the set of control signals comprises a signal driver for each transmission line operable to impose a three-state signal upon said each transmission line, each three-state signal corresponding to a trinary digit or a data clock.

3. The system according to claim 1 wherein said means in signal communication with the transmission lines for converting said trinary digit signals thereon comprises:
   (a) a signal receiving means in communication with each of said transmission lines for producing bipolar signals corresponding to signals on their respective transmission lines, and
   (b) means for converting the bipolar signals to binary digits plus the data clock.

* * * * *